US012772711B2

(12) United States Patent
Ma et al.

(10) Patent No.: US 12,772,711 B2
(45) Date of Patent: Oct. 20, 2026

(54) DISPLAY PANEL, DISPLAY MODULE AND DISPLAY DEVICE

(71) Applicant: KUNSHAN NEW FLAT PANEL DISPLAY TECHNOLOGY CENTER CO., LTD., Kunshan (CN)

(72) Inventors: Chufang Ma, Kunshan (CN); Won Jun Song, Kunshan (CN); Mihwa Ha, Kunshan (CN); Yu Gao, Kunshan (CN); Tiantian Li, Kunshan (CN)

(73) Assignee: Kunshan New Flat Panel Display Technology Center Co., Ltd., Kunshan (CN)

( * ) Notice: Subject to any disclaimer, the term of this patent is extended or adjusted under 35 U.S.C. 154(b) by 120 days.

(21) Appl. No.: 18/899,433

(22) Filed: Sep. 27, 2024

(65) Prior Publication Data

US 2025/0024742 A1 Jan. 16, 2025

(30) Foreign Application Priority Data

Oct. 31, 2023 (CN) ......................... 202311435518.3

(51) Int. Cl.
*H10K 59/80* (2023.01)
*H10H 20/855* (2025.01)

(52) U.S. Cl.
CPC ......... *H10K 59/879* (2023.02); *H10H 20/855* (2025.01)

(58) Field of Classification Search
CPC ........................... H10K 59/879; H10H 20/855
See application file for complete search history.

(56) References Cited

U.S. PATENT DOCUMENTS

| | | | |
|---|---|---|---|
| 11,329,257 | B2 | 5/2022 | Ju et al. |
| 2016/0155979 | A1 | 6/2016 | Yim et al. |
| 2016/0240589 | A1 | 8/2016 | Jeong |
| 2020/0280023 | A1 | 9/2020 | Ha et al. |

(Continued)

FOREIGN PATENT DOCUMENTS

| | | | |
|---|---|---|---|
| CN | 107195797 | B | 11/2019 |
| CN | 110828517 | A | 2/2020 |

(Continued)

OTHER PUBLICATIONS

Extended Search Report issued on Apr. 1, 2025, in corresponding European Application No. 24203206.8, 9 pages.

(Continued)

*Primary Examiner* — Anne M Hines
(74) *Attorney, Agent, or Firm* — Maier & Maier, PLLC

(57) ABSTRACT

A display panel, a display module and a display device. The display panel includes: a substrate in a stacked arrangement, a light-emitting device layer, a light extraction layer assembly, and a barrier layer; wherein the light extraction layer assembly includes at least two light extraction layers in a stacked arrangement, the at least two light extraction layers including a primary extraction layer and at least one secondary extraction layer disposed on one side of the primary extraction layer or on two opposite sides of the primary extraction layer, and the primary extraction layer has a refractive index greater than that of the secondary extraction layer; and the secondary extraction layer has a refractive index greater than that of the barrier layer.

18 Claims, 2 Drawing Sheets

(56) References Cited

U.S. PATENT DOCUMENTS

| | | | | |
|---|---|---|---|---|
| 2020/0373521 | A1 | 11/2020 | Wang | |
| 2021/0328186 | A1 * | 10/2021 | Ikeda | H10K 59/8792 |
| 2021/0359274 | A1 * | 11/2021 | Kim | H10K 59/8731 |
| 2022/0011889 | A1 | 1/2022 | Shin et al. | |

FOREIGN PATENT DOCUMENTS

| | | | |
|---|---|---|---|
| CN | 113097413 | A | 7/2021 |
| CN | 113675245 | A | 11/2021 |
| CN | 115715113 | A | 2/2023 |
| JP | 2006004917 | A | 1/2006 |
| KR | 1020150052490 | A | 5/2015 |
| KR | 1020180116187 | A | 10/2018 |
| KR | 1020210043055 | A | 4/2021 |
| KR | 1020210141309 | A | 11/2021 |
| KR | 1020230003713 | A | 1/2023 |

OTHER PUBLICATIONS

Office Action issued on Apr. 14, 2025, in corresponding Korean Application No. 10-2024-0141165, 15 pages.

Office Action issued on Oct. 7, 2025, in corresponding Japanese Application No. 2024-179713, 6 pages.

* cited by examiner

DISPLAY PANEL, DISPLAY MODULE AND DISPLAY DEVICE

CROSS REFERENCE TO RELATED APPLICATION

This application claims priority to the Chinese Patent Application No. 202311435518.3, filed on Oct. 31, 2023, which is incorporated herein by reference in its entirety.

TECHNICAL FIELD

The present application relates to the technical field of display, and particularly to a display panel, a display module and a display device.

BACKGROUND

Organic Light Emitting Diode (OLED) display has the advantages of low cost, wide viewing angle, low driving voltage, fast response speed, rich light-emitting colours, simple preparation process, and large-area flexible display, etc., which is considered as one of the most promising display technologies. However, the existing display technology still needs to be improved.

SUMMARY

Embodiments of the present application provide a display panel, a display module and a display device.

In a first aspect, embodiments of the present application provide a display panel comprising: a substrate; a light-emitting device layer disposed on a side of the substrate; a light extraction layer assembly disposed on a side of the light-emitting device layer facing away from the substrate, wherein the light extraction layer assembly comprises at least two light extraction layers in a stacked arrangement, and the at least two light extraction layers comprise a primary extraction layer and at least one secondary extraction layer, when the at least two light extraction layers comprise one secondary extraction layer, the secondary extraction layer is disposed on one side of the primary extraction layer, when the at least two light extraction layers comprise two or more secondary extraction layers, the two or more secondary extraction layers are disposed on one side or two opposite sides of the primary extraction layer, and wherein the primary extraction layer has a refractive index greater than that of the secondary extraction layer; and a barrier layer disposed on a side of the light extraction layer assembly facing away from the substrate.

According to an embodiment of the first aspect of the present application, the secondary extraction layer has a refractive index from 1.3 to 1.7; or the primary extraction layer has a refractive index $n_2$ from 2.0 to 2.5.

According to an embodiment of the first aspect of the present application, the secondary extraction layer comprises: at least one first secondary extraction layer provided on a side of the primary extraction layer facing towards the substrate; at least one second secondary extraction layer provided on a side of the primary extraction layer facing away from the substrate; the first secondary extraction layer has a refractive index $n_1$ from 1.3 to 1.7; and the second secondary extraction layer has a refractive index $n_3$ from 1.3 to 1.6.

According to an embodiment of the first aspect of the present application, the at least two light extraction layers comprise two or more secondary extraction layers; the secondary extraction layers are provided on the two opposite sides of the primary extraction layer, and the refractive indices of the secondary extraction layers disposed on the two opposite sides of the primary extraction layer are the same.

According to an embodiment of the first aspect of the present application, a plurality of secondary extraction layers are disposed on one side of the primary extraction layer, and the refractive indices of the plurality of secondary extraction layers decrease gradually in the direction from the primary extraction layer pointing towards the secondary extraction layer.

According to an embodiment of the first aspect of the present application, the primary extraction layer has a thickness greater than that of the secondary extraction layer; the primary extraction layer has a thickness $d_2$ from 40 nm to 90 nm; or the secondary extraction layer has a thickness from 10 nm to 70 nm.

According to an embodiment of the first aspect of the present application, the secondary extraction layer comprises: at least one first secondary extraction layer provided on a side of the primary extraction layer facing towards the substrate; at least one second secondary extraction layer provided on a side of the primary extraction layer facing away from the substrate; the first secondary extraction layer has a thickness greater than that of the second secondary extraction layer; the first secondary extraction layer has a thickness $d_1$ from 5 nm to 30 nm; or the second secondary extraction layer has a thickness $d_3$ from 10 nm to 50 nm; or the light extraction layer assembly has the thickness $D_1=d_1+d_2+d_3$ and satisfies $80\ nm<D_1=d_1+d_2+d_3<150\ nm$.

According to an embodiment of the first aspect of the present application, the refractive index of the secondary extraction layer is greater than that of the barrier layer; the refractive index of the secondary extraction layer is from 1.3 to 1.7; or the refractive index of the barrier layer is from 1.2 to 1.5.

According to an embodiment of the first aspect of the present application, the difference between the refractive index of the barrier layer and the refractive index of the secondary extraction layer at a wavelength of 460 nm is from 0 to 0.4.

According to an embodiment of the first aspect of the present application, the secondary extraction layer comprises: at least one first secondary extraction layer disposed on a side of the primary extraction layer facing towards the substrate; at least one second secondary extraction layer disposed on a side of the primary extraction layer facing away from the substrate; and the difference $\Delta n1$ between the refractive index $n_3$ of the second secondary extraction layer at the wavelength of 460 nm and the refractive index $n_4$ of the barrier layer at the wavelength of 460 nm meets $0<\Delta n1$ $(n_3-n_4)<0.4$.

According to an embodiment of the first aspect of the present application, the light-emitting device layer comprises a first electrode layer which is stacked with the light extraction layer assembly and the barrier layer, and the secondary extraction layer comprises at least one first secondary extraction layer, provided on the side of the primary extraction layer facing towards the substrate; and the first electrode layer, the at least one first secondary extraction layer, and the primary extraction layer have a transmittance of 40-55% at a wavelength of 460 nm.

According to an embodiment of the first aspect of the present application, the first electrode layer, the at least one first secondary extraction layer and the primary extraction layer have a transmittance of 50-65% at a wavelength of 530 nm.

According to an embodiment of the first aspect of the present application, the first electrode layer, the at least one first secondary extraction layer and the primary extraction layer have a transmittance of 55-70% at a wavelength of 620 nm.

According to an embodiment of the first aspect of the present application, the barrier layer has a transmittance of 80-95%.

According to an embodiment of the first aspect of the present application, the secondary extraction layer further comprises: at least one second secondary extraction layer disposed on a side of the primary extraction layer facing away from the substrate; the at least one second secondary extraction layer has a transmittance of 85-95%.

According to an embodiment of the first aspect of the present application, the secondary extraction layer comprises at least one first secondary extraction layer disposed on the side of the primary extraction layer facing towards the substrate; the material of the first secondary extraction layer has an extinction coefficient of less than 0.0001 at a wavelength of 460 nm, and the difference between the refractive index at the wavelength of 460 nm and the refractive index at the wavelength of 620 nm is less than 0.03.

According to an embodiment of the first aspect of the present application, the secondary extraction layer further comprises at least one second secondary extraction layer disposed on the side of the primary extraction layer facing away from the substrate; the material of the second secondary extraction layer has an extinction coefficient of less than 0.0001 at a wavelength of 460 nm, and the difference between the refractive index at the wavelength 460 nm and the refractive index at the wavelength 620 nm is less than 0.03.

According to an embodiment of the first aspect of the present application, the light-emitting device layer comprises a plurality of light-emitting units, each of the light-emitting units having an orthogonal projection on the substrate located in orthogonal projection area of the light extraction layer assembly on the substrate; or the light-emitting device layer comprises a light-emitting unit of a first colour and a light-emitting unit of a second colour, the orthogonal projection of the light-emitting unit of the first colour on the substrate being located within the orthogonal projection area of the light extraction layer assembly on the substrate, and the orthogonal projection of the light-emitting unit of the second colour on the substrate being located outside the orthogonal projection area of the light extraction layer assembly on the substrate.

According to an embodiment of the first aspect of the present application, the material of the barrier layer comprises at least one of lithium fluoride, sodium fluoride, calcium fluoride and potassium fluoride; the barrier layer has a thickness da from 20 nm to 40 nm.

In a second aspect, embodiments of the present application provide a display device comprising the display panel as described above.

Compared with the prior art, the present application has at least the following technical effects:

The embodiments of the present application provide a display panel designing a light extraction layer assembly and a barrier layer above the light emitting device layer, and designing the light extraction layer assembly as a multi-layer structure, which achieves the effect of improving the light output effect and efficiency by matching the refractive index of the multi-layer structure.

DESCRIPTION OF THE DRAWINGS

Features, advantages and technical effects of exemplary embodiments of the present application will be described below with reference to the accompanying drawings.

The accompanying drawings are labelled.

Figure 1:
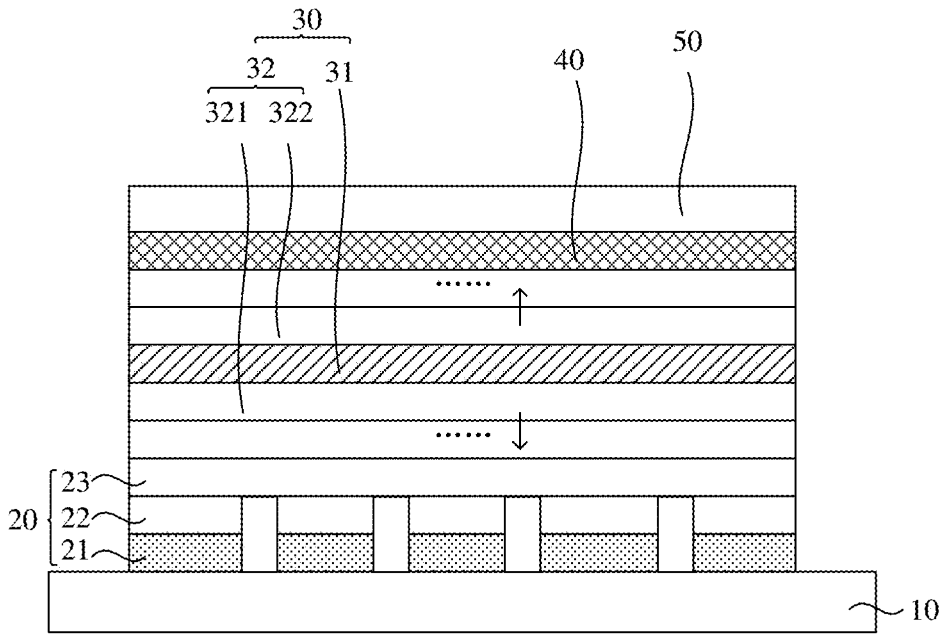
FIG. 1 is a schematic diagram of the structure of a display panel according to an embodiment of the present application.

- 10, substrate; 20, a light-emitting device layer; 20*a*, a light-emitting unit of a first colour; 20*b*, a light-emitting unit of a second colour; 21, a second electrode layer; 22, a light-emitting structure; 23, a first electrode layer; 24; a pixel definition layer;
- 30, a light extraction layer assembly; 31, a primary extraction layer; 32, a secondary extraction layer; 321, a first secondary extraction layer; 322, a second secondary extraction layer;
- 40, a barrier layer; and 50, an encapsulation layer.

In the accompanying drawings, the same components use the same accompanying markings. The accompanying drawings are not drawn to actual scale.

DETAILED DESCRIPTION

Features and exemplary embodiments of various aspects of the present application will be described in details below. In the following detailed description, a number of specific details are presented in order to provide a full understanding of the present application. However, it will be apparent to those skilled in the art that the present application can be implemented without some of these specific details. The following description of embodiments is provided solely for the purpose of providing a better understanding of the present application by illustrating examples of the application. In the accompanying drawings and the following description, at least some of the well-known structures and techniques are not illustrated in order to avoid unnecessary ambiguity to the present application; and, the dimensions of some of the structures may be exaggerated for clarity. Furthermore, the features, structures or characteristics described below may be combined in one or more embodiments in any suitable manner.

The words of orientation appearing in the following description are in the directions shown in the drawings and are not intended to limit the specific structure of the array substrate and display panel of the present application. In the description of the present application, it is to be noted that, unless otherwise expressly provided and limited, the terms ‘mounting’ and ‘connecting’ are to be broadly construed, e.g., they may be fixedly connected, removably connected, or integrally connected; they may be directly connected, or indirectly connected. To a person of ordinary skill in the art, the specific meanings of the above terms in the present application may be understood on a case-by-case basis.

Due to the mismatch of the refractive indices of the film layers in the display panel and the energy loss at the interface of the electrode and the organic material, there is a problem of low light extraction efficiency of the display panel.

In view of this, embodiments of the present application provide a display panel, a display module, and a display device capable of improving the light extraction efficiency. In order to better understand the present application, each embodiment of the display panel and the display device will be described below in conjunction with the accompanying drawings.

The following first describes the display panel provided by the embodiments of the present application, and the display panel provided by the embodiments of the present application may be an OLED display panel.

In a first aspect, the embodiments of the present application provide a display panel comprising: a substrate 10; a light-emitting device layer 20 provided on one side of the substrate 10; a light extraction layer assembly 30, provided on the side of the light emitting device layer 20 facing away from the substrate 10, wherein the light extraction layer assembly 30 comprises at least two light extraction layers in a stacked arrangement, the at least two light extraction layers comprise a primary extraction layer 31 and at least one secondary extraction layer 32, the secondary extraction layer is provided on one side or on two opposite sides of the primary extraction layer 31, and wherein the primary extraction layer 31 has a refractive index greater than that of the secondary extraction layer; and a barrier layer 40 disposed on the side of the light extraction layer assembly 30 facing away from the substrate 10.

Figure 4:
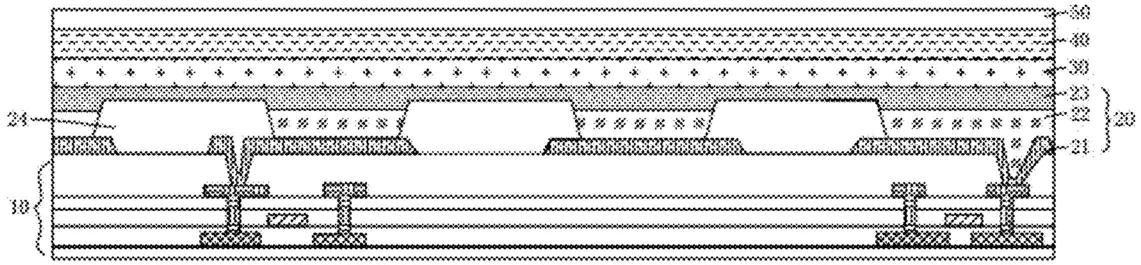
FIG. 4 is a schematic diagram of the structure of another display panel according to an embodiment of the present application.
Figure 5:
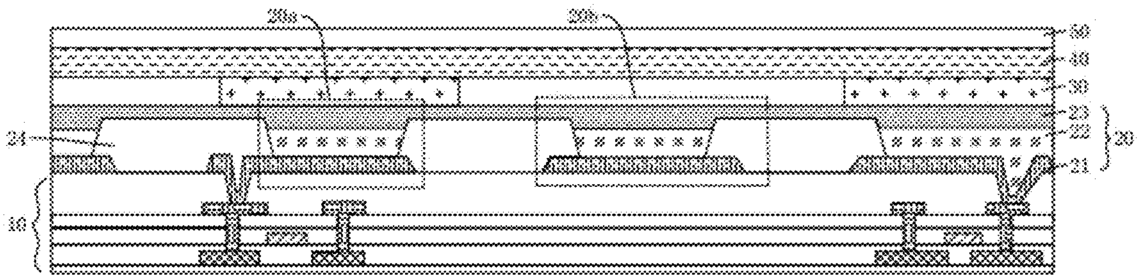
FIG. 5 is a schematic diagram of the structure of another display panel according to an embodiment of the present application.

In some embodiments, referring to FIGS. 4 and 5, the substrate 10 may be a substrate 10 having a certain circuit structure for driving the light-emitting device layer 20 disposed thereon for light-emitting display. Optionally, the substrate 10 may include a substrate and an array substrate, and the array substrate may include driving circuitry. For example, the array substrate may include a first conductive layer, a second conductive layer, and a third conductive layer provided on one side of the substrate and in a stacked arrangement. An insulating layer is provided between adjacent conductive layers. Exemplarily, the pixel driving circuit provided in the array substrate includes a transistor and a storage capacitor. The transistor includes a semiconductor, a gate, a source, and a drain. The storage capacitor includes a first plate and a second plate. As an example, the gate and the first plate may be located in the first conductive layer, the second plate may be located in a second conductive layer, and the source and drain may be located in a third conductive layer. The display panel further comprises a pixel defining layer 24, the pixel defining layer 24 being provided on the substrate and comprising a pixel defining portion and a pixel opening, and a light-emitting structure 22 may be provided within the pixel opening to realize a light-emitting display of the display panel. The substrate 10 may provide cushioning, protection, or support for the display panel, and the substrate 10 may be a flexible substrate, the material of which may, for example, include one or more of polyimide (PI), polyethylene naphthalate (PEN), or polyethylene terephthalate (PET). The substrate 10 may also be a rigid substrate, for example, it may be a glass substrate.

The light-emitting device layer 20 is provided on one side of the substrate 10, and the light-emitting device layer 20 is driven by an electrical signal to emit light for display, and the emitted light can pass through the light extraction layer assembly 30 and the barrier layer 40.

The light-emitting device layer 20 may include a plurality of light-emitting units distributed in an array; each light-emitting unit may include a second electrode layer 21, a light-emitting structure 22, and a first electrode layer 23 disposed sequentially from bottom to top, wherein the second electrode layer 21 is disposed close to the substrate 10 relative to the first electrode layer 23. In some embodiments, the light emitting structure 22 has a refractive index from 1.8 to 2.1.

Optionally, the second electrode layer 21 may be an anode, the light-emitting structure 22 may be a layer structure formed of organic light-emitting material, and the first electrode layer 23 may be a cathode, i.e., the display panel is an OLED display panel. In other embodiments, the display panel may also be a micro-LED display panel. The second electrode layer 21 may be a structure of a three-layer superposition of a transparent conductive layer, a reflective conductive layer, and a transparent conductive layer, which has an all-reflective characteristic. The transparent conductive layer may be selected from any one or more of indium tin oxide (ITO), indium zinc oxide (IZO), and aluminium zinc oxide (AZO). The reflective conductive layer may be silver or copper. The first electrode layer 23 may be made of ITO. The second electrode layer 21 and the light-emitting structure 22 may be an array-distributed structure, and the first electrode layer 23 may be a whole layer covering each light-emitting structure 22, or it may be set up to be array-distributed corresponding to each light-emitting structure 22. There is no limitation to the specific structure of the first electrode layer 23 in the present application. The light-emitting unit of this embodiment may include light-emitting units of multiple colours, for example, a red light-emitting unit, a green light-emitting unit and a blue light-emitting unit, and the light-emitting units of different colours are arranged in accordance with predetermined rules, and the present application does not impose any restriction on the specific rules for their arrangement.

Figure 2:
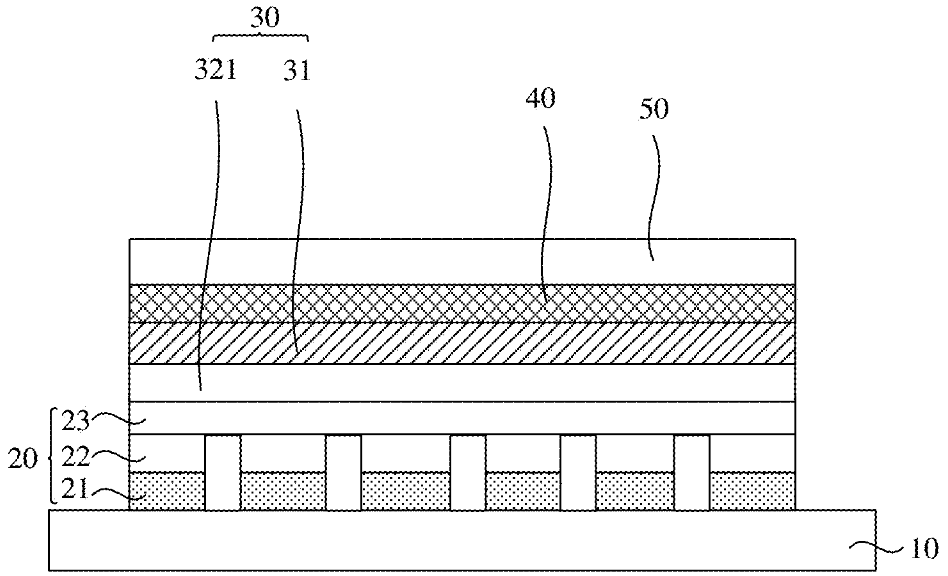
FIG. 2 is a schematic diagram of the structure of another display panel according to an embodiment of the present application.
Figure 3:
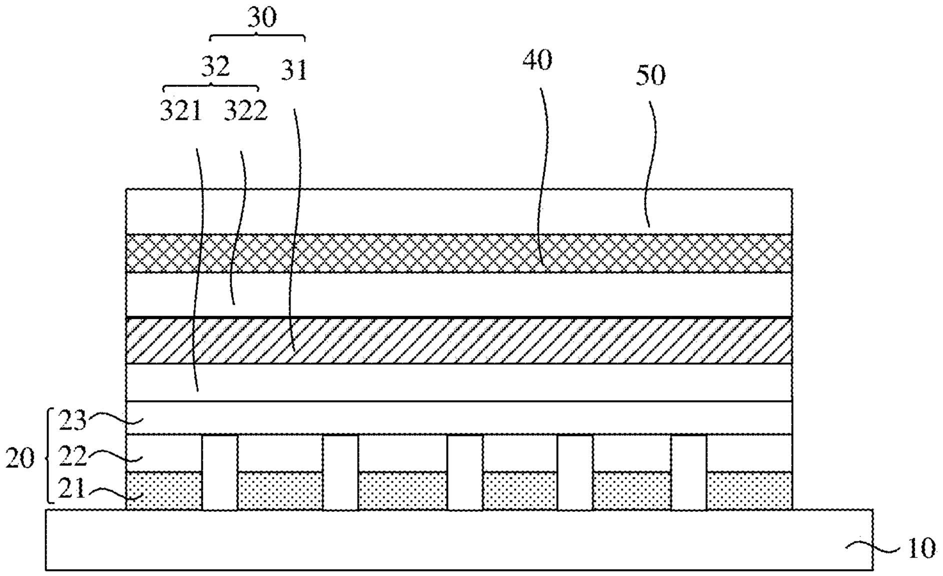
FIG. 3 is a schematic diagram of the structure of another display panel according to an embodiment of the present application.

Please continue to refer to FIGS. 1 to 3, the light extraction layer assembly 30 is provided on the side of the light-emitting device layer 20 that is facing away from the substrate 10, and the light extraction layer assembly 30 can cover and protect the light-emitting device layer 20 from the top; the barrier layer 40 is provided on the side of the light extraction layer assembly 30 that is facing away from the substrate 10, and the barrier layer 40 can cover and protect the light extraction layer assembly 30 from the top.

The light extraction layer assembly 30 includes at least two light extraction layers stacked on top of each other, and the at least two light extraction layers include a primary extraction layer 31 and an secondary extraction layer 32, the secondary extraction layer 32 includes at least one layer, the secondary extraction layer 32 is disposed on one side of the primary extraction layer 31 or on two opposite sides of the primary extraction layer 31, and the refractive index of the primary extraction layer 31 is greater than that of the secondary extraction layer 32. The at least two layers of the light extraction layer can increase the optical interference distance and improve the efficiency of light extraction.

In some embodiments, the secondary extraction layer 32 comprises at least one layer, and the refractive index of the secondary extraction layer 32 disposed on a single side of the primary extraction layer 31 decreases from the direction of the primary extraction layer 31 pointing towards the secondary extraction layer 32.

Exemplarily, the secondary extraction layer 32 is provided on only one side of the primary extraction layer 31 facing towards the substrate 10, the secondary extraction layer 32 includes multiple layers, and the refractive indices of the multiple layers of the secondary extraction layer 32 on the side of the primary extraction layer 31 facing towards the substrate 10 decreases gradually in the direction from the primary extraction layer 31 pointing towards the secondary extraction layer 32.

Exemplarily, the secondary extraction layer 32 is provided on both the side of the primary extraction layer 31 facing towards the substrate 10 and the side of the primary extraction layer 31 facing away from the substrate 10. The secondary extraction layer 32 provided on the side of the primary extraction layer 31 facing towards the substrate 10 includes a plurality of layers, and the refractive indices of the plurality of layers of the secondary extraction layer 32 on the side of the primary extraction layer 31 facing towards the substrate 10 decrease in the direction from the primary extraction layer 31 pointing towards the secondary extraction layer 32; the secondary extraction layers 32 provided on the two opposite sides of the primary extraction layer 31 include a plurality of layers, and the secondary extraction layer 32 provided on the side of the primary extraction layer 31 facing towards the substrate 10 includes a plurality of layers. The secondary extraction layer 32 provided on the side of the primary extraction layer 31 facing away from the substrate 10 includes a plurality of layers, and the refractive indices of the plurality of secondary extraction layers 32 on the side of the primary extraction layer 31 facing away from the substrate 10 decreases in the direction from the primary extraction layer 31 pointing towards the secondary extraction layer 32. Referring to FIG. 1, the arrows point in a direction that includes the primary extraction layer 31 pointing toward the secondary extraction layer 32.

In some embodiments, the secondary extraction layer 32 provided on the side of the primary extraction layer 31 facing towards the substrate 10 is at least two layers, and the secondary extraction layer 32 provided on the side of the primary extraction layer 31 facing away from the substrate 10 is a single layer; or the secondary extraction layer 32 provided on the side of the primary extraction layer 31 facing towards the substrate 10 is a single layer, and the secondary extraction layer 32 provided on the side of the primary extraction layer 31 facing away from the substrate 10 is at least two layers.

The barrier layer 40 is capable of protecting the light extraction layer assembly 30 and the light-emitting device layer 20 disposed thereunder to prevent damage to the light extraction layer assembly 30 and the light-emitting device layer 20 disposed thereunder during the process of forming the encapsulation layer 50. The refractive index of the barrier layer 40 is smaller than that of the secondary extraction layer, which is used to adjust the light emitted from the light-emitting device layer 20, and cooperate with the light extraction layer assembly 30 to increase the intensity of the light extraction.

The encapsulation layer 50 is provided on the side of the barrier layer 40 facing away from the substrate 10, and optionally, the edges of the encapsulation layer 50 are bonded with the substrate 10 to ensure the encapsulation effect and to prevent water and oxygen from invading into the light-emitting device layer 20 and affecting the display.

A display panel provided by an embodiment of the present application designs the light extraction layer assembly 30 and the barrier layer 40 above the light-emitting device layer 20, and designs the light extraction layer assembly 30 as a multi-layer structure, and achieves the effect of improving the light extraction effect and efficiency by matching the refractive index of the multi-layer structure.

Referring to FIG. 2, in some embodiments, the refractive index of the secondary extraction layer is from 1.3 to 1.7; or, the refractive index $n_2$ of the primary extraction layer is from 2.0 to 2.5, i.e., $n_2$=2.0-2.5.

Exemplarily, the refractive index of the secondary extraction layer is 1.3, 1.4, 1.5, 1.6, or 1.7; and the refractive index $n_2$ of the primary extraction layer is 2.0, 2.1, 2.2, 2.3, 2.4, or 2.5. It is to be noted that, if not otherwise stated, the refractive index described herein refers to the refractive index of the material to light at a wavelength of 460 nm.

In the present application, the refractive index is matched by the secondary extraction layer and the primary extraction layer in the light extraction layer assembly 30 in order to form a system that can adjust the light emission direction of the light-emitting device layer 20 and enhance the light extraction efficiency of the light-emitting device layer 20, so that the light extraction efficiency can be enlarged and a better light extraction effect can be achieved.

Referring to FIG. 3, in some embodiments, the secondary extraction layer comprises: at least one first secondary extraction layer 321 disposed on a side of the primary extraction layer 31 facing towards the substrate 10; and at least one second secondary extraction layer 322 disposed on a side of the primary extraction layer 31 facing away from the substrate 10; wherein the first secondary extraction layer has a refractive index $n_1$=1.3-1.7; and the second secondary extraction layer has a refractive index $n_3$=1.3-1.6.

Exemplarily, $n_1$ is 1.3, 1.4, 1.5, 1.6, or 1.7; and $n_3$ is 1.3, 1.4, 1.5, or 1.6.

The light extraction layer assembly 30 includes a first secondary extraction layer 321, a primary extraction layer 31, and a second secondary extraction layer 322 from bottom to top, wherein the refractive index of the primary extraction layer 31 is greater than that of the first secondary extraction layer 321, and the refractive index of the primary extraction layer 31 is greater than that of the second secondary extraction layer 322, and the light extraction layer assembly 30 forms a low refractive index/high refractive index/low refractive index system.

The light-emitting device layer 20 transmits light into the first secondary extraction layer 321. Due to that the refractive index of the first secondary extraction layer 321 is smaller than that of the primary extraction layer 31, most of the light can be refracted into the primary extraction layer 31 at the interface therebetween; the refracted light is refracted again into the second secondary extraction layer 322 between the primary extraction layer 31 and the second secondary extraction layer 322; at the same time, the reflected light at the interface between the primary extraction layer 31 and the second secondary extraction layer 322 may also interfere with the light refracted by the first secondary extraction layer 321, and the repeated refraction and reflection of the multi-layer light extraction layer assembly 30 increases the optical interference and optimizes the efficiency of the light extraction.

In some embodiments, the secondary extraction layer is provided on the two opposite sides of the primary extraction layer, and the secondary extraction layers located on the two opposite sides of the primary extraction layer have the same refractive index. For example, the first secondary extraction layer 321 has a refractive index of 1.5, the primary extraction layer 31 has a refractive index of 1.4, and the second secondary extraction layer 322 may have a refractive index of 1.5. When the refractive index of the first secondary encapsulation layer 421 and the refractive index of the second secondary encapsulation layer 422 are the same, there may be fewer losses of light at the interfaces, and the efficiency of light extraction may be improved. In some embodiments, the refractive index of the first secondary extraction layer 321 and the refractive index of the second secondary extraction layer 322 may also be different, for example, the refractive index of the first secondary extraction layer 321 is 1.5, the refractive index of the primary extraction layer 31 is 1.4, and the refractive index of the second secondary extraction layer 322 may be 1.6.

In some embodiments, the material of the multi-layer secondary extraction layer 32 may be the same, and the material of the multi-layer secondary extraction layer may be different. For example, the materials of the first secondary extraction layer 321 and the second secondary extraction layer 322 may be the same or different.

In some embodiments, the material of the primary extraction layer in the light extraction layer assembly is an organic material.

In some embodiments, the material of the secondary extraction layer in the light extraction layer assembly is an organic material.

The materials in the light extraction layer assembly are all organic, which can reduce the stress between the film layers, and at the same time make the panel's form adjustable, for example, it can be rolled or folded. Exemplarily, the material of the light extraction layer assembly 30 includes a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and cellulose propionate acetate (CPA). The light extraction layer assembly 30 may be vaporized in a single chamber, saving one vaporization chamber compared to conventional optical structures. In some embodiments, the thickness of the primary extraction layer is greater than that of the secondary extraction layer; optionally, the thickness of the primary extraction layer is 40 nm$<d_2<$90 nm; optionally, the thickness of the secondary extraction layer is 10 nm-70 nm.

Exemplarily, $d_2$ is 45 nm, 50 nm, 55 nm, 60 nm, 65 nm, 70 nm, 75 nm, 80 nm, or 85 nm; the thickness of the secondary extraction layer is 15 nm, 20 nm, 25 nm, 30 nm, 35 nm, 40 nm, 45 nm, 50 nm, 55 nm, 60 nm, or 65 nm.

The thickness of each layer of the light extraction layer assembly 30 is within the above range, which ensures that it is matched with its refractive index to achieve a better light extraction effect.

In some embodiments, the secondary extraction layer comprises: at least one first secondary extraction layer disposed on a side of the primary extraction layer facing towards the substrate; at least one second secondary extraction layer disposed on a side of the primary extraction layer facing away from the substrate; the thickness of the first secondary extraction layer is greater than that of the second secondary extraction layer; optionally, the thickness of the first secondary extraction layer, $d_1$, is from 5 nm to 30 nm; the thickness of the second secondary extraction layer, $d_3$, is from 10 nm to 50 nm; optionally, the thickness of the light extraction layer assembly is $D_1=d_1+d_2+d_3$ which satisfies 80 nm$<D_1=d_1+d_2+d_3<$150 nm.

Exemplarily, $d_1$ is 5 nm, 15 nm, 20 nm, 22 nm, 25 nm, 28 nm, or 30 nm; and $d_3$ is 15 nm, 20 nm, 25 nm, 30 nm, 35 nm, 40 nm, or 45 nm.

The thickness of each layer of the light extraction layer assembly 30 is within the above range, which can ensure that it can be matched with its refractive index to achieve a better light extraction effect. Embodiments of the present application improve the light extraction efficiency by adjusting the refractive index and thickness of the light extraction layer assembly 30.

In some embodiments, the refractive index of the secondary extraction layer is greater than that of the barrier layer; optionally, the refractive index of the secondary extraction layer is from 1.3 to 1.7; optionally, the refractive index of the barrier layer is from 1.2 to 1.5.

Exemplarily, the refractive index of the secondary extraction layer is 1.3, 1.4, 1.5, 1.6, or 1.7; and the refractive index of the barrier layer is 1.2, 1.3, 1.4, or 1.5.

According to embodiments of the present application, the refractive index of the primary extraction layer is greater than that of the secondary extraction layer, and the refractive index of the secondary extraction layer is greater than that of the barrier layer, and the light extraction layer assembly and the barrier layer can form a structure with a low refractive index, a high refractive index, and a low refractive index, and form a microcavity with the light-emitting device layer 20, and then light emitted from the light-emitting device layer 20 is enhanced under the microcavity, and thus the efficiency of the light extraction can be improved.

In some embodiments, the difference in refractive index between the barrier layer and the secondary extraction layer at a wavelength of 460 nm is from 0 to 0.4.

The smaller difference in the refractive index of the barrier layer 40 and the refractive index of the secondary extraction layer 32 reduces the total reflection at the light out interface of the light extraction layer assembly 30.

In some embodiments, the secondary extraction layer comprises: at least one first secondary extraction layer disposed on a side of the primary extraction layer facing towards the substrate; at least one second secondary extraction layer disposed on a side of the primary extraction layer facing away from the substrate; and the difference $\Delta n1$ between the refractive index $n_3$ of the second secondary extraction layer at a wavelength of 460 nm and the refractive index $n_4$ of the barrier layer at a wavelength of 460 nm satisfies $0<\Delta n1\ (n_3-n_4)<0.4$. Exemplary ground, $\Delta n1$ is 0.2, 0.3, or 0.4.

According to an embodiment of the present application, the refractive index of the primary extraction layer is greater than that of the first secondary extraction layer, the refractive index of the primary extraction layer is greater than that of the second secondary extraction layer, the refractive index of the second secondary extraction layer is greater than that of the barrier layer, thus the light extraction layer assembly and the barrier layer can form a low refractive index/high refractive index/low refractive index structure, and form a microcavity with the light-emitting device layer 20, and the light emitted from the light-emitting device layer 20 can be enhanced under the action of microcavity, and the light extraction efficiency can be improved. The light extraction layer assembly 30 and the barrier layer 40 can be coordinated to adjust the optical interference distance and inhibit the external light reflection, thereby improving the light extraction efficiency. Due to that the refractive index of the second secondary extraction layer 322 is greater than that of the barrier layer 40, most of the light at the interface therebetween can be refracted into the barrier layer 40.

The difference between the refractive index of the barrier layer 40 and the refractive index of the second secondary extraction layer 322 is small, which can reduce the total reflection at the light out interface of the light extraction layer assembly 30.

In some embodiments, the first secondary extraction layer 321 has a refractive index $n_1$=1.3 to 1.7; the primary extraction layer 31 has a refractive index $n_2$=2.0 to 2.5; the second secondary extraction layer 322 has a refractive index $n_3$=1.3 to 1.6; and the barrier layer 40 has a refractive index $n_4$=1.2 to 1.5.

Exemplarily, $n_1$ is 1.3, 1.4, 1.5, 1.6 or 1.7; $n_2$ is 2.0, 2.1, 2.2, 2.3, 2.4 or 2.5; $n_3$ is 1.3, 1.4, 1.5 or 1.6; and $n_4$ is 1.2, 1.3, 1.4 or 1.5.

According to an embodiment of the present application, the refractive index of the first secondary extraction layer 321 is lower than that of the primary extraction layer 31, and the refractive index of the second secondary extraction layer 322 is lower than that of the primary extraction layer 31; thus it can form a low refractive index/high refractive index/low refractive index structure, and form a microcavity with the light-emitting device layer 20, and the light emitted from the light-emitting device layer 20 can be enhanced under the action of microcavity, and the light extraction efficiency can be improved.

The refractive index of each layer of the light extraction layer assembly and the refractive index of the barrier layer 40 are within the above range, which ensures that the layers cooperate with each other to achieve a better light extraction effect.

In some embodiments, the barrier layer 40 has a transmittance T1 of 80 to 95%, and the second secondary extraction layer 322 has a transmittance T2 of is 85 to 95%.

Exemplarily, T1 is 80%, 82%, 84%, 86%, 88%, 90%, 92%, 93%, or 95%; and T2 is 85%, 86%, 87%, 88%, 89%, 90%, 92%, 93%, or 95%.

In some embodiments, the light-emitting device layer 20 comprises a first electrode layer 23 which is provided in a stacked arrangement with the light extraction layer assembly 30 and the barrier layer 40. The first electrode layer 23, the first secondary extraction layer 321, and the primary extraction layer 31 have a transmittance T3 of 40-55% at a wavelength of 460 nm, a transmittance T4 of 50-65% at a wavelength of 530 nm, a transmittance T4 of 50-65% at a wavelength of 620 nm, and a transmittance T5 is 55-70%. The wavelengths described herein are wavelengths of light.

Exemplarily, T3 is 40%, 42%, 44%, 46%, 48%, 50%, 52%, 53%, or 55%; T4 is 50%, 52%, 54%, 56%, 58%, 60%, 62%, 63%, or 65%; and T6 is 55%, 57%, 59%, 60%, 62%, 64%, 66%, 68%, or 70%.

The embodiments of the present application can increase the light extraction effect by adjusting the transmittances of the first electrode layer 23, the first secondary extraction layer 321, the primary extraction layer 31, the second secondary extraction layer 322 and the barrier layer 40.

In some embodiments, the material of the first secondary extraction layer 321 has an extinction coefficient at a wavelength of 460 nm of less than 0.0001, and the difference between the refractive index of the first secondary extraction layer 321 at the wavelength of 460 nm and the refractive index at the wavelength of 620 nm is less than 0.03; the material of the second secondary extraction layer 322 has an extinction coefficient at a wavelength of 460 nm of less than 0.0001, and the difference between the refractive index of the second secondary extraction layer 322 at the wavelength of 460 nm and the refractive index at the wavelength of 620 nm is less than 0.03.

Based on the consideration of the relationship between the wave band and the luminescent colour, such a setting can increase the light extraction effect.

In some embodiments, referring to FIG. 4, the light-emitting device layer 20 includes a plurality of light-emitting units, and each light-emitting unit's orthogonal projection on the substrate is located within the orthogonal projection area of the light extraction layer assembly on the substrate.

The orthogonal projection of the light extraction layer assembly on the substrate covers the orthogonal projection of each light-emitting unit on the substrate; preferably, the orthogonal projection of the light extraction layer assembly on the substrate coincides with the orthogonal projection of each light-emitting unit on the substrate. This ensures that the light extraction layer assembly 40 is provided directly above each light-emitting unit.

In some embodiments, referring to FIG. 5, the light-emitting device layer comprises a first colour light-emitting unit 20*a* and a second colour light-emitting unit 20*b*, the first colour light-emitting unit 20*a* having an orthogonal projection on the substrate 10 within the orthogonal projection area of the light extraction layer assembly 30 on the substrate 10, the second colour light-emitting unit 20*b* having an orthogonal projection on the substrate 10 outside the orthogonal projection area of the light extraction layer assembly 30 on the substrate 10. Optionally, the first colour is blue and the second colour is red or green. The present application does not limit this.

In some embodiments, the material of the barrier layer 40 comprises at least one of lithium fluoride, sodium fluoride, calcium fluoride, and potassium fluoride.

In the related technology, the material of the barrier layer 40 is selected as lithium fluoride. The atomic radius of the lithium atom is small, which makes it easy for the lithium ions in the lithium fluoride to diffuse to the first electrode layer 23 of the light-emitting device layer 20, i.e., the cathode, through the light extraction layer assembly 30, thereby compounding with the electrons on the cathode, increasing the operating voltage, and thereby increasing the power consumption of the display panel as a whole.

The barrier layer 40 is selected from one or more of sodium fluoride, calcium fluoride, and potassium fluoride. Due to that the atomic radii of the cations contained in each of the sodium fluoride, calcium fluoride, and potassium fluoride are larger compared to that of the lithium ions, they are less likely to diffuse to the cathode through the light extraction layer assembly 30 and have an effect on the voltage of the cathode.

In some embodiments, the barrier layer has a thickness $d_4$ from 20 nm to 40 nm. Exemplarily, da is 25 nm, 28 nm, 30 nm, 32 nm, 35 nm, or 38 nm.

The thickness of each layer of the light extraction layer assembly 30 and the thickness of the barrier layer 40 are within the above range, which can be ensured to match with the refractive index thereof to achieve a better light extraction effect. The embodiment of the present application improves the light extraction efficiency by adjusting the refractive index and thickness of the light extraction layer assembly 30 and the barrier layer 40.

In a second aspect, embodiments of the present application provide a display module comprising a display panel as described above.

Since the display module according to the embodiments of the present application includes the display panel of any of the above embodiments, the beneficial effects of the display panel of the above embodiments are available and will not be repeated herein. Among other things, the display module according to the embodiments of the present application may include a structure such as a polarizer, a touch control layer, and a cover plate. The polarizer is disposed between the touch control layer and the display panel, and the cover plate is disposed on a side of the touch control layer facing away from the display panel.

In a third aspect, embodiments of the present application provide a display device including the above-mentioned display panel or the above-mentioned display module.

The display device according to the embodiments of the present application includes, but is not limited to, a mobile phone, a Personal Digital Assistant (PDA), a tablet computer, an e-book, a television, a doorstop, a smart landline phone, a console, and other devices with display functions.

Since the display device according to the embodiments of the present application includes a display panel of any of the above-described embodiments, the beneficial effects of the display panel of the above embodiments are available and will not be repeated herein.

The following examples describe the disclosure of the present application more specifically, and these examples are used for expository illustration only, as various modifications and changes within the scope of the present application will be apparent to those skilled in the art.

Example 1

The display panel included: a substrate, a light-emitting device layer 20, a light extraction layer assembly 30, a barrier layer 40 and an encapsulation layer 50 provided in a stacked arrangement.

The light-emitting device layer 20 included a second electrode layer 21, a light-emitting structure 22, and a first electrode layer 23 from bottom to top, wherein the light-emitting structure 22 had a refractive index of 1.9.

The light extraction layer assembly 30 included a first secondary extraction layer 321, a primary extraction layer 31, and a second secondary extraction layer 322 from bottom to top, all of which were made of organic material, wherein the first secondary extraction layer 321 had a refractive index $n_1$ of 1.5 and a thickness of 20 nm, the primary extraction layer 31 had a refractive index $n_2$ of 2.3 and a thickness of 50 nm, and the second secondary extraction layer 322 had a refractive index $n_3$ of 1.5 and a thickness of 10 nm.

The barrier layer 40 was LiF with a refractive index $n_4$ of 1.3 and a thickness of 35 nm.

Example 2

A display panel had a similar structure as the display panel of Example 1, with the difference that the first secondary extraction layer 321 had a refractive index $n_1$ of 1.5 and a thickness of 20 nm; the primary extraction layer 31 had a refractive index $n_2$ of 2.4 and a thickness of 55 nm; and the second secondary extraction layer 322 had a refractive index $n_3$ of 1.6 and a thickness of 20 nm;

The barrier layer 40 was LiF with a refractive index $n_4$ of 1.3 and a thickness of 35 nm.

Example 3

A display panel had a similar structure as the display panel of Example 1, with the difference that the first secondary extraction layer 321 had a refractive index $n_1$ of 1.4 and a thickness of 15 nm; the primary extraction layer 31 had a refractive index $n_2$ of 2.3 and a thickness of 50 nm; and the second secondary extraction layer 322 had a refractive index $n_3$ of 1.5 and a thickness of 15 nm;

The barrier layer 40 was LiF with a refractive index $n_4$ of 1.2 and a thickness of 30 nm.

Comparative Example 1

A display panel had a similar in structure as the display panel of Example 1, with the difference that the light extraction layer assembly 30 comprised a single organic light extraction layer and a LiF layer, wherein the organic light extraction layer had a refractive index of 2.3 and a thickness of 70 nm, and the LiF layer had a refractive index of 1.3 and a thickness of 30 nm.

The white light efficiencies of Examples 1-3 and Comparative Example 1 were shown in Table 1.

TABLE 1

White light efficiency of Examples 1-3 and Comparative Example 1

| Scheme | Light extraction layer assembly | | | Barrier layer | Δn1 (n3 − n4) | Transmittance of cathode/first secondary extraction layer/primary extraction layer @460 nm | @530 nm | @620 nm | Transmittance of first secondary extraction layer | Transmittance of barrier layer | White light efficiency |
|---|---|---|---|---|---|---|---|---|---|---|---|
| Example 1 | $n_1 = 1.5$ | $n_2 = 2.3$ | $n_3 = 1.5$ | $n_4 = 1.3$ | 0.2 | 45% | 53% | 60% | 87% | 90% | 105% |
| Example 2 | $n_1 = 1.5$ | $n_2 = 2.4$ | $n_3 = 1.6$ | $n_4 = 1.3$ | 0.2 | 46% | 52% | 58% | 90% | 89% | 106% |
| Example 3 | $n_1 = 1.4$ | $n_2 = 2.3$ | $n_3 = 1.5$ | $n_4 = 1.2$ | 0.2 | 48% | 57% | 65% | 90% | 84% | 108% |
| Comparative Example 1 | | 2.3 | | 1.3 | | | | | | 85% | 100% |

As can be seen from Table 1, Example 1 to Example 3 of the present application matched the refractive index and thickness by means of the structure of the light extraction layer assembly and the barrier layer, in order to form a system that can adjust the direction of the light emission of the light-emitting device layer and enhance the light extraction efficiency of the light-emitting device layer, so that the light extraction efficiency can be increased to achieve a better light extraction effect. Among them the refractive index $n_2$ of the primary extraction layer was greater than the refractive index $n_1$ of the first secondary extraction layer, and the refractive index $n_2$ of the primary extraction layer was greater than the refractive index $n_3$ of the second secondary extraction layer, and the refractive index $n_3$ of the second secondary extraction layer was greater than the refractive index $n_4$ of the barrier layer, and the light extraction layer assembly formed the low refractive index/high refractive index/low refractive index system, and the light extraction layer assembly formed the low refractive index/ high refractive index/low refractive index system with the barrier layer System. The light emitted from the light-emitting device layer transmitted into the first secondary extraction layer, and due to that the refractive index of the first extraction layer is lower than that of the primary extraction layer, most of the light rays can be refracted into the primary extraction layer at the interface between the two layers; the refracted light was refracted into the second secondary extraction layer again at the primary extraction layer and the second secondary extraction layer. At the same time, the light reflected from the interface between the primary extraction layer and the second secondary extraction layer can also interfere with the light reflected from the first secondary extraction layer, and after repeated refraction and reflection of the multi-layer light extraction layer assembly, optical interference was increased, and the light extraction efficiency was optimized. In addition the refractive index $n_3$ of the second secondary extraction layer had a smaller difference with the refractive index $n_4$ of the barrier layer, which reduces the total reflection of the light at the interface of the light extraction layer assembly. Compared with the Comparative Example 1, the present application improves the light extraction efficiency by optimizing the structure.

While the application has been described with reference to the preferred embodiments, various modifications may be made and equivalents may be substituted for parts thereof without departing from the scope of the application. In particular, as long as there is no structural conflict, each technical feature mentioned in each embodiment can be combined in any manner. The present application is not limited to the specific embodiments disclosed herein, but includes all technical solutions falling within the scope of the claims.

What is claimed is:

1. A display panel, comprising:

a substrate;

a light-emitting device layer disposed on one side of the substrate;

a light extraction layer assembly disposed on a side of the light-emitting device layer facing away from the substrate, wherein:

the light extraction layer assembly comprises at least two light extraction layers in a stacked arrangement, and the at least two light extraction layers comprise a primary extraction layer and at least one secondary extraction layer, when the at least two light extraction layers comprise one secondary extraction layer, the secondary extraction layer is disposed on one side of the primary extraction layer, when the at least two light extraction layers comprise two or more secondary extraction layers, the two or more secondary extraction layers are disposed on one side or two opposite sides of the primary extraction layer, the primary extraction layer has a refractive index greater than that of the secondary extraction layer; and a barrier layer disposed on a side of the light extraction layer assembly faces away from the substrate;

the primary extraction layer has a thickness greater than that of the secondary extraction layer; the primary extraction layer has a thickness d2 from 40 nm to 90 nm; or the secondary extraction layer has a thickness from 10 nm to 70 nm;

the secondary extraction layer comprises: at least one first secondary extraction layer provided on a side of the primary extraction layer facing toward the substrate; at least one second secondary extraction layer provided on a side of the primary extraction layer facing away from the substrate; and the first secondary extraction layer has a thickness greater than that of the second secondary extraction layer; or the first secondary extraction layer has a thickness d1 from 5 nm to 30 nm; the second secondary extraction layer has a thickness d3 from 10 nm to 50 nm; or the light extraction layer assembly has a thickness D1=d1+d2+d3 and satisfies 80 nm<D1=d1+d2+d3<150 nm.

2. The display panel according to claim 1, wherein the secondary extraction layer has a refractive index from 1.3 to 1.7; or the primary extraction layer has a refractive index n2 from 2.0 to 2.5.

3. The display panel according to claim 2, wherein the secondary extraction layer comprises: at least one first secondary extraction layer provided on a side of the primary extraction layer facing towards the substrate; at least one second secondary extraction layer provided on a side of the primary extraction layer facing away from the substrate; wherein the first secondary extraction layer has a refractive index n1 from 1.3 to 1.7; and the second secondary extraction layer has a refractive index n3 from 1.3 to 1.6.

4. The display panel according to claim 2, wherein the at least two light extraction layers comprise two or more secondary extraction layers; the secondary extraction layers are provided on the two opposite sides of the primary extraction layer, and the refractive indices of the secondary extraction layers disposed on the two opposite sides of the primary extraction layer are the same.

5. The display panel according to claim 2, wherein a plurality of secondary extraction layers are disposed on one side of the primary extraction layer, and the refractive indices of the plurality of secondary extraction layers decrease gradually in the direction from the primary extraction layer pointing towards the secondary extraction layer.

6. The display panel according to claim 1, wherein the secondary extraction layer has a refractive index greater than that of the barrier layer; the secondary extraction layer has a refractive index from 1.3 to 1.7; or the barrier layer has a refractive index from 1.2 to 1.5.

7. The display panel according to claim 6, wherein the difference between the refractive index of the barrier layer and the refractive index of the secondary extraction layer at a wavelength of 460 nm is from 0 to 0.4.

8. The display panel according to claim 1, wherein the secondary extraction layer comprises at least one first secondary extraction layer disposed on the side of the primary extraction layer facing towards the substrate; the material of the first secondary extraction layer has an extinction coefficient of less than 0.0001 at a wavelength of 460 nm, and the difference between the refractive index at the wavelength of 460 nm and the refractive index at the wavelength of 620 nm is less than 0.03.

9. The display panel according to claim 8, wherein the secondary extraction layer further comprises at least one second secondary extraction layer disposed on the side of the primary extraction layer facing away from the substrate; the material of the second secondary extraction layer has an extinction coefficient of less than 0.0001 at a wavelength of 460 nm, and the difference between the refractive index at the wavelength 460 nm and the refractive index at the wavelength 620 nm is less than 0.03.

10. The display panel according to claim 1, wherein the light-emitting device layer comprises a plurality of light-emitting units, each of the light-emitting units having an orthogonal projection on the substrate located in orthogonal projection area of the light extraction layer assembly on the substrate; or the light-emitting device layer comprises a light-emitting unit of a first color and a light-emitting unit of a second color, the orthogonal projection of the light-emitting unit of the first color on the substrate being located within the orthogonal projection area of the light extraction layer assembly on the substrate, and the orthogonal projection of the light-emitting unit of the second color on the substrate being located outside the orthogonal projection area of the light extraction layer assembly on the substrate.

11. The display panel according to claim 1, wherein the material of the barrier layer comprises at least one of lithium fluoride, sodium fluoride, calcium fluoride and potassium fluoride;

the barrier layer has a thickness d4 from 20 nm to 40 nm.

12. A display device, comprising the display panel according to claim 1.

13. A display panel, comprising:

a substrate;

a light-emitting device layer disposed on one side of the substrate;

a light extraction layer assembly disposed on a side of the light-emitting device layer facing away from the substrate, wherein:

the light extraction layer assembly comprises at least two light extraction layers in a stacked arrangement, the at least two light extraction layers comprise a primary extraction layer and at least one secondary extraction layer, when the at least two light extraction layers comprise one secondary extraction layer, the secondary extraction layer is disposed on one side of the primary extraction layer, when the at least two light extraction layers comprise two or more secondary extraction layers, the two or more secondary extraction layers are disposed on one side or two opposite sides of the primary extraction layer, the primary extraction layer has a refractive index greater than that of the secondary extraction layer;

a barrier layer disposed on a side of the light extraction layer assembly faces away from the substrate;

the secondary extraction layer has a refractive index greater than that of the barrier layer; the secondary extraction layer has a refractive index from 1.3 to 1.7; or the barrier layer has a refractive index from 1.2 to 1.5; and the secondary extraction layer comprises:

at least one first secondary extraction layer disposed on a side of the primary extraction layer facing toward the substrate;

at least one second secondary extraction layer disposed on a side of the primary extraction layer faces away from the substrate; and the difference Δn1 between the refractive index n3 of the second secondary extraction layer at the wavelength of 460 nm and the refractive index n4 of the barrier layer at the wavelength of 460 nm meets $0<\Delta n1\ (n3-n4)<0.4$.

14. A display panel, comprising:

a substrate;

a light-emitting device layer disposed on one side of the substrate;

a light extraction layer assembly disposed on a side of the light-emitting device layer facing away from the substrate, wherein:

the light extraction layer assembly comprises at least two light extraction layers in a stacked arrangement, the at least two light extraction layers comprise a primary extraction layer and at least one secondary extraction layer, when the at least two light extraction layers comprise one secondary extraction layer, the secondary extraction layer is disposed on one side of the primary extraction layer, when the at least two light extraction layers comprise two or more secondary extraction layers, the two or more secondary extraction layers are disposed on one side or two opposite sides of the primary extraction layer, the primary extraction layer has a refractive index greater than that of the secondary extraction layer;

a barrier layer disposed on a side of the light extraction layer assembly faces away from the substrate;

the light-emitting device layer comprises a first electrode layer which is stacked with the light extraction layer assembly and the barrier layer, and the secondary extraction layer comprises at least one first secondary extraction layer, provided on the side of the primary extraction layer facing toward the substrate; and the first electrode layer, the at least one first secondary extraction layer, and the primary extraction layer have a transmittance of 40-55% at a wavelength of 460 nm.

15. The display panel according to claim 14, wherein the first electrode layer, the at least one first secondary extraction layer and the primary extraction layer have a transmittance of 50-65% at a wavelength of 530 nm.

16. The display panel according to claim 14, wherein the first electrode layer, the at least one first secondary extraction layer and the primary extraction layer have a transmittance of 55-70% at a wavelength of 620 nm.

17. The display panel according to claim 14, wherein the barrier layer has a transmittance of 80 to 95%.

18. The display panel according to claim 14, wherein the secondary extraction layer further comprises: at least one second secondary extraction layer disposed on a side of the primary extraction layer facing away from the substrate; the at least one second secondary extraction layer has a transmittance of 85-95%.

* * * * *